(12) United States Patent
van Putten et al.

(10) Patent No.: US 11,014,386 B2
(45) Date of Patent: May 25, 2021

(54) ACTUATION MECHANISM FOR ACCURATELY CONTROLLING DISTANCE IN OVJP PRINTING

(71) Applicant: UNIVERSAL DISPLAY CORPORATION, Ewing, NJ (US)

(72) Inventors: Peter van Putten, Eindhoven (NL); Sven Pekelder, Eindhoven (NL); Mark Meuwese, Eindhoven (NL); Maurits Willenbroek, Eindhoven (NL); Piet van Rens, Eindhoven (NL)

(73) Assignee: Universal Display Corporation, Ewing, NJ (US)

( * ) Notice: Subject to any disclaimer, the term of this patent is extended or adjusted under 35 U.S.C. 154(b) by 31 days.

(21) Appl. No.: 15/483,251

(22) Filed: Apr. 10, 2017

(65) Prior Publication Data

US 2017/0291187 A1    Oct. 12, 2017

Related U.S. Application Data

(60) Provisional application No. 62/320,970, filed on Apr. 11, 2016.

(51) Int. Cl.
| | | |
|---|---|---|
| *B41J 25/308* | (2006.01) | |
| *B41J 25/316* | (2006.01) | |
| *B41J 11/00* | (2006.01) | |
| *B41J 25/00* | (2006.01) | |

(52) U.S. Cl.
CPC .......... *B41J 25/308* (2013.01); *B41J 11/008* (2013.01); *B41J 25/001* (2013.01); *B41J 25/3086* (2013.01); *B41J 25/316* (2013.01)

(58) Field of Classification Search
None
See application file for complete search history.

(56) References Cited

U.S. PATENT DOCUMENTS

| | | | |
|---|---|---|---|
| 4,769,292 A | 9/1988 | Tang et al. | |
| 4,949,098 A * | 8/1990 | Gluck | B41J 25/316 |
| | | | 347/197 |
| 5,247,190 A | 9/1993 | Friend et al. | |
| 5,703,436 A | 12/1997 | Forrest et al. | |
| 5,707,745 A | 1/1998 | Forrest et al. | |
| 5,834,893 A | 11/1998 | Bulovic et al. | |
| 5,844,363 A | 12/1998 | Gu et al. | |
| 6,013,982 A | 1/2000 | Thompson et al. | |

(Continued)

FOREIGN PATENT DOCUMENTS

| | | |
|---|---|---|
| WO | WO-2008057394 A1 | 5/2008 |
| WO | WO-2010011390 A2 | 1/2010 |

OTHER PUBLICATIONS

Baldo, "Highly efficient phosphorescent emission from organic electroluminescent devices," Nature, vol. 395, pp. 151-154, 1998.

(Continued)

*Primary Examiner* — Binu Thomas
(74) *Attorney, Agent, or Firm* — Butzel Long

(57) ABSTRACT

A device for use in organic vapor jet printing (OVJP) and similar arrangements includes a print head movable in more than one degree of freedom with sufficient thermal insulation that there is little to no movement in the Z direction. One or more sensors may be used to monitor and adjust the distance between the substrate and the print head.

20 Claims, 5 Drawing Sheets

(56) References Cited

U.S. PATENT DOCUMENTS

| | | | |
|---|---|---|---|
| 6,087,196 A | 7/2000 | Sturm et al. | |
| 6,091,195 A | 7/2000 | Forrest et al. | |
| 6,097,147 A | 8/2000 | Baldo et al. | |
| 6,294,398 B1 | 9/2001 | Kim et al. | |
| 6,303,238 B1 | 10/2001 | Thompson et al. | |
| 6,337,102 B1 | 1/2002 | Forrest et al. | |
| 6,468,819 B1 | 10/2002 | Kim et al. | |
| 6,523,934 B1 * | 2/2003 | Beauchamp | B41J 25/003 347/37 |
| 7,279,704 B2 | 10/2007 | Walters et al. | |
| 7,431,968 B1 | 10/2008 | Shtein et al. | |
| 7,968,146 B2 | 6/2011 | Wagner et al. | |
| 2003/0079625 A1 * | 5/2003 | O'Hara | B41J 25/316 101/59 |
| 2003/0230980 A1 | 12/2003 | Forrest et al. | |
| 2004/0047665 A1 * | 3/2004 | DeVore | B41J 25/3088 400/55 |
| 2004/0174116 A1 | 9/2004 | Lu et al. | |
| 2005/0206714 A1 * | 9/2005 | Greiser | B41J 2/1752 347/108 |
| 2007/0030329 A1 * | 2/2007 | Wiens | B41J 25/316 347/171 |
| 2007/0062383 A1 * | 3/2007 | Gazeau | B41J 3/4073 101/35 |
| 2007/0285652 A1 * | 12/2007 | Nielsen | H04N 1/1013 356/237.2 |
| 2009/0225145 A1 * | 9/2009 | Codos | B41J 25/308 347/102 |
| 2013/0155140 A1 * | 6/2013 | Calamita | B41J 25/003 347/19 |
| 2013/0208036 A1 * | 8/2013 | Forrest | B41J 25/3082 347/8 |

OTHER PUBLICATIONS

Baldo, "Very high-efficiency green organic light-emitting devices based on electrophosphorescence," Applied Physics Letters, vol. 75, No. 1, pp. 4-6, Jul. 5, 1999.

* cited by examiner

ACTUATION MECHANISM FOR ACCURATELY CONTROLLING DISTANCE IN OVJP PRINTING

CROSS-REFERENCE TO RELATED APPLICATIONS

This application is a non-provisional and claims the benefit of U.S. Provisional Patent Application Ser. No. 62/320,970, tiled Apr. 11, 2016, the entire contents of which is incorporated herein by reference.

PARTIES TO A JOINT RESEARCH AGREEMENT

The claimed invention was made by, on behalf of, and/or in connection with one or more of the following parties to a joint university corporation research agreement: Regents of the University of Michigan, Princeton University, University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to devices for performing organic vapor jet printing, and devices such as organic light emitting diodes and other devices, including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the following structure:

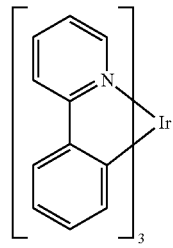

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher"

HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

According to an embodiment, a device is provided that includes a print head configured to eject an organic material toward a substrate, at least one elastic member connecting the print head to a motion frame such that the print head is adjustable in more than a single degree of freedom, and a first actuator that provides control of the print head in a direction essentially perpendicular to the substrate. The elastic member may include a leaf spring or similar structure. The device may further include at least one sensor connected to the print head via a thermal barrier, which is arranged and configured to measure a distance to the substrate. The first actuator may adjust the distance to the substrate based on a measurement obtained by the at least one sensor. The at least one sensor may include two sensors arranged on opposite sides of the print head. The thermal barrier may include one or more leaf springs or similar structures, and may be made of any suitable material including steel, Inconel, combinations thereof, or similar materials. During operation of the device, the thermal barrier may cause a thermal gradient in a direction essentially parallel to the substrate, for example, instead of in the Z direction. The print head may be any suitable print head, such as an organic vapor jet printing (OVJP) print head. The device may include an injection block in fluid communication with the print head and rigidly connected to the print head; and the motion frame itself, which may be rigidly connected to the injection block. The injection block may be rigidly connected to the motion frame at a support position, such that movement of the support position causes a movement of the print head in a direction essentially perpendicular to the substrate, and/or a change of the angle between the print head and the substrate. The device may include a second actuator which, when actuated in conjunction with the first actuator, adjusts the position of the print head along an axis essentially perpendicular to the substrate. Each of the first and second actuators may adjust the position of the print head via rotation of the print head relative to different points.

In an embodiment, a method of operating a deposition apparatus is provided, which includes activating the deposition apparatus to cause a print head to eject material toward a substrate, receiving data from one or more sensors physically connected to the print head, the data indicating a distance between the print head and the substrate, and actuating at least one actuator to adjust the distance between the print head and the substrate based upon the data. The adjustment of the actuator may a movement of the print head in a direction essentially perpendicular to the substrate, and/or a change of the angle between the print head and the substrate. Adjusting the actuator may cause an adjustment of the position of the print head via rotation of the print head relative to the substrate. Adjusting the actuator may cause a change in the position of the print head along an axis essentially perpendicular to the substrate. The method may be used with any suitable deposition apparatus as disclosed herein, such as an OVJP apparatus.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
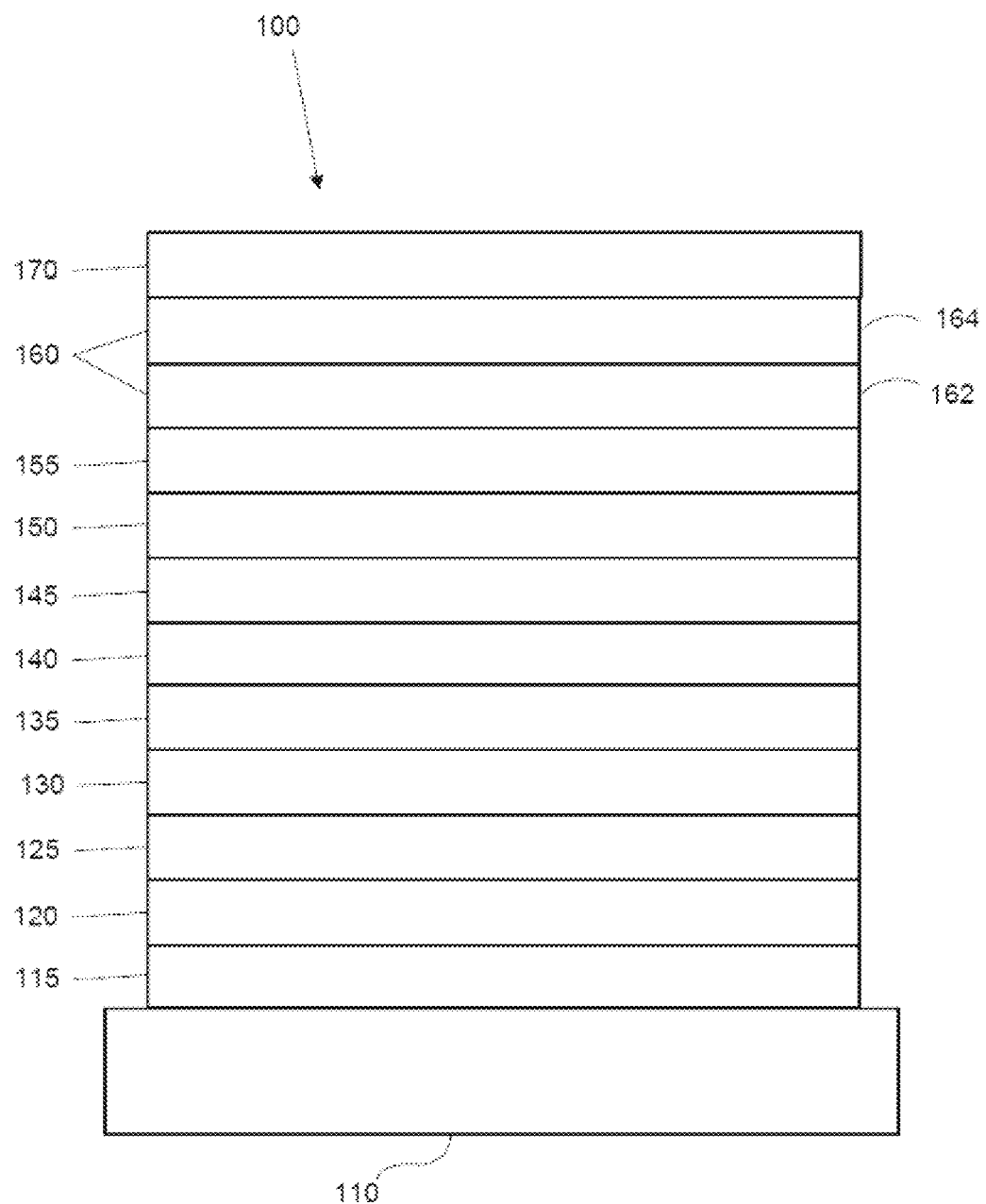
FIG. 1 shows an organic light emitting device that may be fabricated using devices and techniques disclosed herein.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
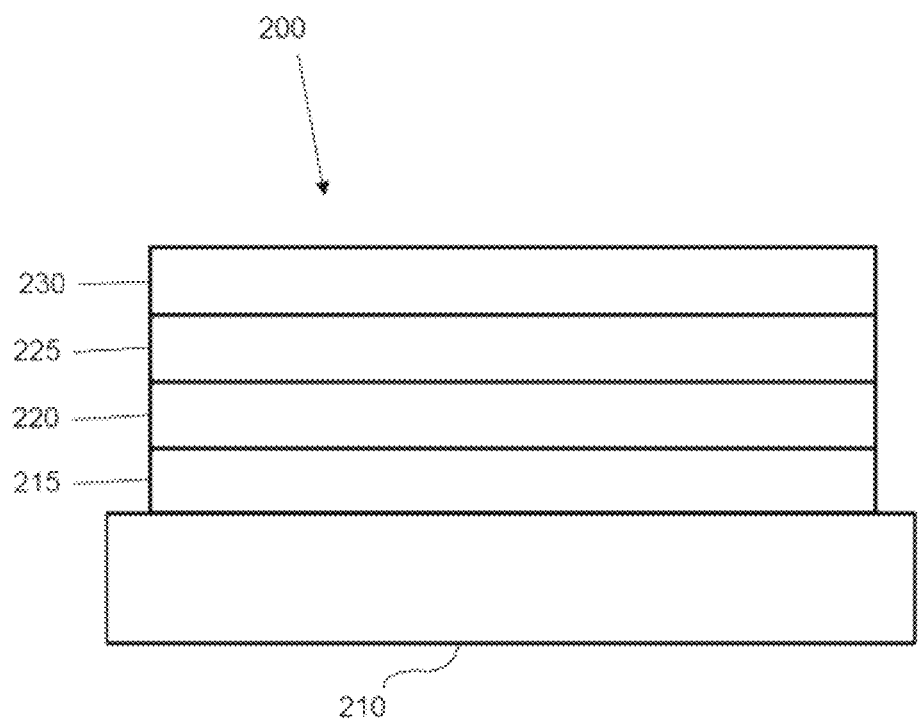
FIG. 2 shows an inverted organic light emitting device that does not have a separate electron transport layer that may be fabricated using devices and techniques disclosed herein.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJP. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, cell phones, tablets, phablets, personal digital assistants (PDAs), laptop computers, digital cameras, camcorders, viewfinders, microdisplays less than 2 inches diagonal, 3-D displays, virtual reality or augmented reality displays, vehicles, video walls comprising multiple displays tiled together, theater or stadium screens, and signs. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to +80 C.

As previously disclosed, OVJP-type techniques often are used to fabricate OLEDs or portions of OLEDs. Existing OVJP systems typically use a Z-stage and a sensor to control the deposition distance between the OVJP nozzle and the substrate on which material is deposited and the OLED is fabricated. When using more than one nozzle, the parallelism between the OVJP nozzle array and the substrate generally has a relatively large influence on the accuracy of the deposition distance. Furthermore, current OVJP systems do not allow for control of the angle between the nozzle array and the substrate, resulting in a relatively limited accuracy in deposition distance.

Conventional OVJP deposition systems also generally require that the print head and surrounding structure is maintained at an elevated temperature to ensure that the material being deposited remains in gas state and does not condense in the deposition system structure. In current systems the sensor determining the vertical distance between the print head and the substrate is mounted on a cool part of the equipment, and not directly coupled to the print head. Due to thermal drift, such an arrangement increases the uncertainty of the distance. Furthermore, it also decreases the accuracy of the sensor measurements due to the resulting longer tolerance chain and inaccuracies in calibration of the relative positions.

Embodiments disclosed herein may include a print head that is adjustable in more than a single degree of freedom. Embodiments also may include, or provide for, active actuation in the Z dimension (i.e., normal to the substrate surface in the direction of the print head) to control the distance to the substrate (i.e., the deposition height). Embodiments disclosed herein also may enable actuation of the phi Y angle, i.e., the angle between the OVJP nozzle(s) and the substrate, thereby enabling the system to keep the print head parallel to the substrate while printing. Sensors measuring the distance between print head and substrate may be directly connected to the print head, enabling a much more accurate measurement of the distance to the substrate.

Figure 3:
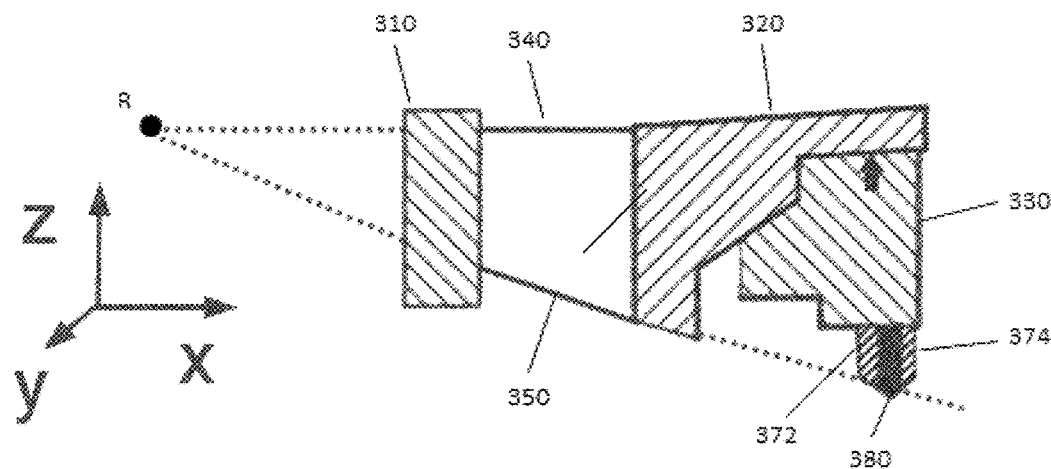
FIG. 3 shows a schematic illustration of a deposition system according to an embodiment disclosed herein.

FIG. 3 shows a schematic illustration of a deposition device according to an embodiment disclosed herein. A print head (PH) 380 including one or more OVJP nozzles is mounted in an injection block 330. The injection block 330 may kept at an elevated temperature, such as to match a temperature of the print head 380. The injection block 330 may be mounted to a PH motion frame 320 such that the thermal conductance is limited, thereby maintaining a lower temperature of the motion frame 320 than is achievable using conventional arrangements. The PH motion frame 320 may be connected to the metrology frame 310 using a stinger 340 and a leaf spring 350. The stinger 340 may comprise a leaf spring that connects to attachment points with tabs rotated to a right angle relative to the leaf. Generally the stinger 340 will be rigid to an axial load, but compliant when a transverse force or load is applied. The metrology ("metro") frame is a rigid structure that may provide support for the PH motion frame, actuation mechanism, substrate stage and/or other internal components required for OVJP. The metro frame is fixed relative to the outside of the OVJP deposition tool. The PH motion frame has six degrees of freedom, three translational and three rotational. The leaf spring 350 prevents the print head motion frame 320 from translating in the X and rotating in the phi Z dimensions. The combination of the leaf spring 350 and stinger 350 may prevent the print head motion frame 320 from translating in Y or rotating in phi X. These two elastic elements thus may fixate all degrees of freedom of motion other than the Z and phi Y directions. The PH motion frame 320 may be supported in the Z direction at two points, one on either side of the motion frame 320. One such position is shown in FIG. 3. The arrow in FIG. 3 indicates the direction of thrust applied to the print head motion frame by one of the elastic cross-hinge levers that can move each side of the print head up and down relative to the substrate.

Figure 4A:
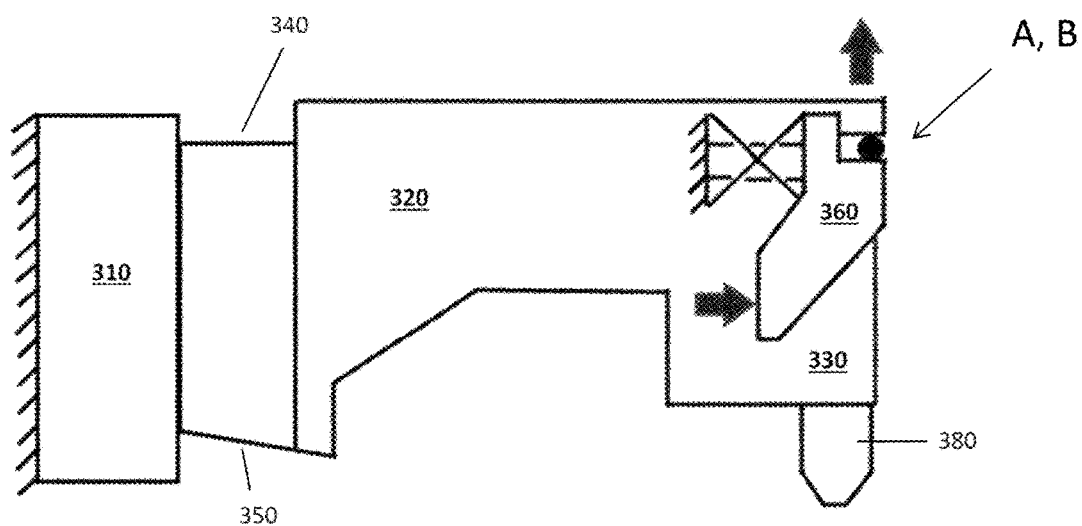
FIG. 4A shows a schematic illustration of a cantilever side view of a deposition system according to an embodiment disclosed herein.

FIG. 4A shows the two support locations for the PH motion frame 320 shown in FIG. 3. Because the injection block 330 is rigidly connected to the motion frame 320 and the print head 380 is rigidly connected to the injection block 330, movement of any of the two (or both) support positions in Z will actuate the print head in Z or phi Y. The horizontal arrow shows the thrust applied to the elastic cross-hinge lever by a pusher, and the vertical arrow shows the direction of thrust applied to the print head motion frame by the elastic cross-hinge lever.

In an embodiment such as shown in FIG. 4A, the actuation is transferred by 90 degrees to allow for positioning of the actuators relatively far from the substrate. An elastic cross hinge lever 360 supports the PH motion frame 320 in the Z direction, while the actuator controls the rotation of the lever 360.

Figure 4B:
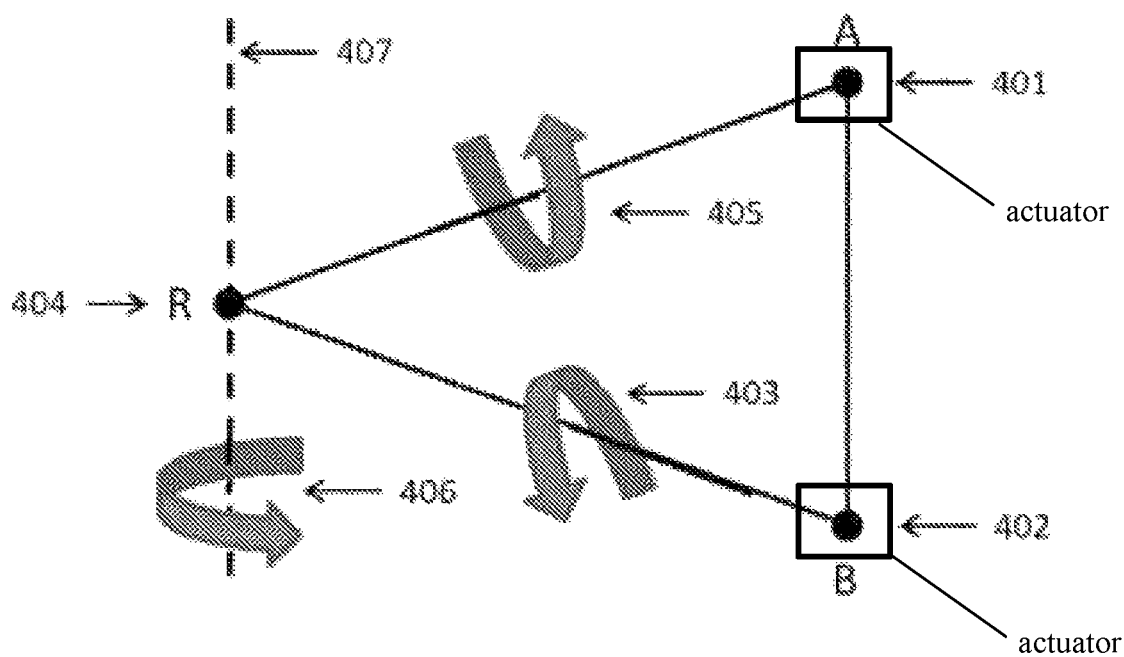
FIG. 4B shows examples of movement of a deposition system according to embodiments disclosed herein.
Figure 5:
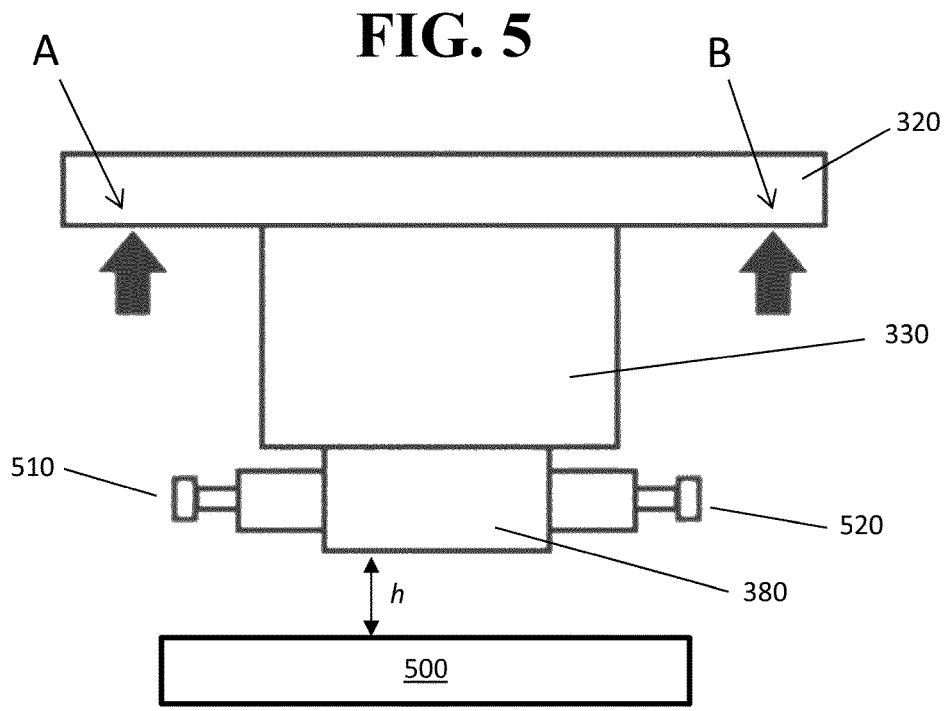
FIG. 5 shows a front view of a deposition system according to an embodiment disclosed herein.

In an embodiment, two degrees of freedom can be controlled by using two actuators. Each actuator may push an elastic cross hinge lever 360, which in turn provides upward thrust onto the PH motion frame 320. The kinematics of the actuation mechanism can be understood by considering three points, point R in FIG. 3 and the points of contact between each elastic cross hinge lever 360 and the PH motion frame 320, as shown in FIGS. 4B and 5 as points A and B. Points R, A, and B define a fixed triangle. R may not correspond to a feature in the mechanism, but is instead a reference point that is fixed in space and has a position determined by the geometry of the actuation mechanism. While the three points are fixed with respect to each other in the plane they define, this plane is free to rotate in two dimensions relative to the metro frame. These motions of these points are illustrated in FIG. 4B. If point A 401 moves and point B 402 is stationary, then A rotates 403 about an axis between point R 404 and point B 402. Likewise, if point B 402 moves and point A 401 is stationary, point B 402 rotates 405 about an axis between point R 404 and point A from the perspective of the reverence frame. If points A and B move together, they both rotate 406 about an axis 407 parallel to the segment connecting point A and B that passes through point R.

In some embodiments, points A and B may move in small displacements centered on positions where the ABR plane is parallel to the XY plane of the metro frame. The distance between point A or B and point R is relatively large compared to the size of the injection block. Since the tangent of the arcs created by their motion is parallel to the Z axis near this home position, they move vertically. If point A moves independently of point B, it raises or lowers one side of the PH motion frame. This also changes the phi Y orientation of the injection block. If A and B move together, the whole PH motion frame is raised or lowered, which changes the Z height while keeping the phi Y angle constant. Any desired set of Z and phi Y within the range of motion of the actuation mechanism can be achieved with a combination of these movements. This allows for adjustment of the OVJP print head 380 relative to the substrate.

In an embodiment, the distance h between the print head 380 and the substrate 500 may be measured by two sensors 510, 520 as shown in FIG. 5. The arrows indicate the direction of thrust applied by each of the elastic cross-hinge levers onto the print head motion frame to allow for control of tilt and elevation of the print head relative to the substrate. The sensors may be mounted directly to the print head 380 by a supporting structure. During operation, a calibration process may be performed to establish the Z position between the sensors 510, 520 and the print head 380, for example to determine the relative offset, if any, between the edge of each sensor 510, 520 and the edge of the print head 380 closest to the substrate. Each sensor also may be calibrated to determine the horizontal distance between the sensor and the print head, for example to determine a relative distance between the region of the substrate below the sensor and the region below the print head. After that, the measured distance from either sensor S1 or S2 can be used to establish the actual distance between the substrate and the print head 380. Alternatively, measurements from both sensors may be used. For example, if there is a discrepancy in the distances measured by the sensors 510, 520, the distances may be averaged to obtain the distance between the print head 380 and the substrate 500.

Figure 6:
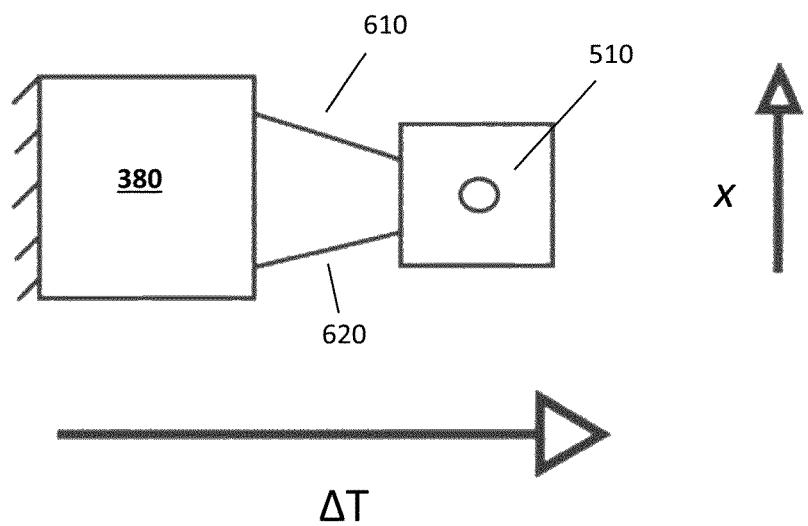
FIG. 6 shows a top view of a sensor mount as shown in FIG. 5 according to an embodiment disclosed herein.

FIG. 6 shows a top view of a sensor mount as shown in FIG. 5. Because the print head 380 typically needs to be heated and the sensor 510 may have a lower resistance to high temperature than the print head, the sensors may be mounted with a thermal barrier between each sensor and the print head. For example, a thermal barrier may be provided by two leaf springs 610, 620 positioned perpendicular, or essentially perpendicular, to the print direction (x-direction). The leaf springs 610, 620 have a small thickness and a relatively large height (in Z). Preferably the leaf springs are made from a material with relatively a low thermal conductance such as stainless steel, Inconel, or the like. This results in a thermal gradient in the X-direction which means any thermal drift occurs in the X direction, not in the Z direction. The thermal gradient in the Z direction is zero or almost zero, which means the thermal drift in this direction, which is more critical to fabricating a uniform deposition, is also zero or almost zero. To enlarge the thermal gradient and obtain a low sensor temperature the cold part of the sensor clamp (where the sensor 510 is mounted) may be cooled by a flexible thermal conductor such as a litze cable. Such a thermal conductor thermally shortcuts the clamp to the cold base.

The z distance between the print head and the substrate typically is less sensitive to angular displacements introduced by thermal and mechanical drifts. The physical volume of components of the system that are in thermal contact with the print head and injection block is reduced or minimized, so as to reduce stresses and displacements created by thermal gradients.

The arrangements disclosed herein may be used to maintain an OVJP or similar print head at a desired relative position and/or distance from a substrate on which the print head is used to deposit material. For example, the sensors 510, 520 may provide distance information to a control unit, which can then compensate for any variation due to thermal drift or other influences. Alternatively or in addition, if an undesirable degree of drift occurs based on information provided by the sensors, deposition may be paused or halted to allow for the arrangement to be re-positioned. As another example, the relative angle between the print head and the substrate may be monitored, maintained, and/or adjusted during deposition as previously disclosed and in a similar fashion to the z height as previously disclosed.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:
1. A device comprising:
 an organic vapor jet printing (OVJP) print head configured to eject an organic material toward a substrate;

at least one elastic member connecting the print head to a motion frame such that the print head is adjustable in at least one rotational degree of freedom and at least one other degree of freedom;
at least one sensor connected to the print head via a thermal barrier, the at least one sensor arranged and configured to measure a distance to the substrate, the thermal barrier comprising: one or more leaf springs, stainless steel, Inconel, or a combination thereof; and
a first actuator that provides control of the print head in a direction essentially perpendicular to the substrate during operation of the print head to eject organic material toward the substrate.

2. The device of claim 1, wherein the at least one elastic member comprises a leaf spring.

3. The device of claim 1, wherein the first actuator is configured to adjust the distance to the substrate based on a measurement obtained by the at least one sensor.

4. The device of claim 1, wherein the at least one sensor comprises two sensors arranged on opposite sides of the print head.

5. The device of claim 1, wherein, the thermal barrier is arranged and configured such that, during operation of the device to deposit material on the substrate, the thermal barrier causes a thermal gradient in a direction essentially parallel to the substrate.

6. The device of claim 1, further comprising:
an injection block in fluid communication with the print head and rigidly connected to the print head; and
the motion frame, wherein the motion frame is rigidly connected to the injection block.

7. The device of claim 6, wherein the injection block is rigidly connected to a motion frame of the print head at a support position, such that movement of the support position causes a movement comprising at least one selected from the group consisting of: movement of the print head in a direction essentially perpendicular to the substrate, and change of the angle between the print head and the substrate.

8. The device of claim 1, further comprising a second actuator which, when actuated in conjunction with the first actuator, adjusts a position of the print head along an axis essentially perpendicular to the substrate.

9. The device of claim 8, wherein each of the first actuator and the second actuator adjust the position of the print head via rotation of the print head relative to different points.

10. The device of claim 1, further comprising a second actuator that provides rotational control of an orientation of the print head.

11. A device comprising:
an organic vapor jet printing (OVJP) print head configured to eject an organic material toward a substrate;
at least one elastic member connecting the print head to a motion frame such that the print head is adjustable in at least one rotational degree of freedom and at least one other degree of freedom;
a first actuator that provides control of the print head in a direction essentially perpendicular to the substrate during operation of the print head to eject organic material toward the substrate; and
a second actuator which, when actuated in conjunction with the first actuator, adjusts a position of the print head along an axis essentially perpendicular to the substrate;
wherein each of the first actuator and the second actuator adjust the position of the print head via rotation of the print head relative to different points.

12. The device of claim 11, wherein the at least one elastic member comprises a leaf spring.

13. The device of claim 11, further comprising at least one sensor connected to the print head via a thermal barrier, the at least one sensor arranged and configured to measure a distance to the substrate.

14. The device of claim 13, wherein the first actuator is configured to adjust the distance to the substrate based on a measurement obtained by the at least one sensor.

15. The device of claim 13, wherein the at least one sensor comprises two sensors arranged on opposite sides of the print head.

16. The device of claim 13, wherein the thermal barrier comprises one or more leaf springs.

17. The device of claim 13, wherein the thermal barrier comprises stainless steel, Inconel, or a combination thereof.

18. The device of claim 13, wherein the thermal barrier is arranged and configured such that, during operation of the device to deposit material on the substrate, the thermal barrier causes a thermal gradient in a direction essentially parallel to the substrate.

19. The device of claim 11, further comprising:
an injection block in fluid communication with the print head and rigidly connected to the print head; and
the motion frame, wherein the motion frame is rigidly connected to the injection block.

20. The device of claim 19, wherein the injection block is rigidly connected to a motion frame of the print head at a support position, such that movement of the support position causes a movement comprising at least one selected from the group consisting of: movement of the print head in a direction essentially perpendicular to the substrate, and change of the angle between the print head and the substrate.

* * * * *